US006086952A

United States Patent [19]

Lang et al.

[11] Patent Number: 6,086,952

[45] Date of Patent: Jul. 11, 2000

[54] CHEMICAL VAPOR DEPOSITION OF A COPOLYMER OF P-XYLYLENE AND A MULTIVINYL SILICON/OXYGEN COMONOMER

[75] Inventors: Chi-I Lang, Sunnyvale; Yeming Jim Ma, Santa Clara; Fong Chang, Los Gatos; Peter Wai-Man Lee, San Jose, all of Calif.; Shin-Puu Jeng, Hsinchu, Taiwan; David Cheung, Foster City, Calif.

[73] Assignee: Applied Materials, Inc., Santa Clara, Calif.

[21] Appl. No.: 09/097,365

[22] Filed: Jun. 15, 1998

[51] Int. Cl.[7] .................................................... C23C 16/00

[52] U.S. Cl. ................................ 427/255.29; 427/255.6; 438/780

[58] Field of Search ........................... 427/255.29, 255.6; 438/780

[56] References Cited

U.S. PATENT DOCUMENTS

| | | | |
|---|---|---|---|
| 3,311,668 | 3/1967 | Spence et al. | 260/668 |
| 3,895,135 | 7/1975 | Hofer | 427/248 |
| 4,438,021 | 3/1984 | Okada et al. | 504/341 |
| 4,500,562 | 2/1985 | Jahn et al. | 427/27 |
| 4,556,584 | 12/1985 | Sarkozy | 427/54.1 |
| 4,945,856 | 8/1990 | Stewart | 118/715 |
| 4,951,601 | 8/1990 | Maydan et al. | 118/719 |
| 4,986,216 | 1/1991 | Ohmori et al. | 118/730 |
| 5,028,573 | 7/1991 | Brown, et al. | 502/66 |
| 5,079,031 | 1/1992 | Yamazaki et al. | 427/38 |
| 5,121,706 | 6/1992 | Nichols et al. | 118/719 |
| 5,270,082 | 12/1993 | Lin et al. | 427/539 |
| 5,310,858 | 5/1994 | Greiner et al. | 528/271 |
| 5,355,832 | 10/1994 | Loh et al. | 118/723 |
| 5,424,097 | 6/1995 | Olson et al. | 427/255.5 |

(List continued on next page.)

FOREIGN PATENT DOCUMENTS 60-63369 4/1985 Japan .

OTHER PUBLICATIONS

Taylor et al., "Parylene Copolymers", Mat. Res. Soc. Symp. Proc., vol. 476, pp. 197–205, Jan. 1998.

M. Szwarc, "New Monomers of the Quinoid Type and Their Polymers," vol. VI, No. 3, pp. 319–329 (no date).

M. Szwarc, "The C–H Bond Energy in Toluene and Xylenes," vol. 16, No. 2, Feb., 1948, pp. 128–136.

John Wiley & Sons, "Encyclopedia of Polymer Science and Engineering", vol. 17, 1989, pp. 990–1005 (no month).

Richard S. Corley, Howard C. Haas, Marshall W. Kane, and Daniel L. Livingston, Preparation and Properties of Poly–p–xylene, vol. XIII, 1954, pp. 137–156.

M. Szwarc, "Some Remarks on the $CH_2=\bigcirc=CH_2$ Molecule," Aug. 13, 1947, pp. 46–49.

Shiegenobu Kawakami, Shingo Iwaki, Masahiro Nakada, and Tatusaki Yamagughi, "The Effect of the Reactor Type on the Selectivity of Thermal Reactions of p–Xylene in Temperature Gradient Systems", The Chemical Society Japan, 1991, vol. 64, No. 3, pp. 1000–1004 (no month).

Martin H. Kaufman, Herman F. Mark, and Robert B. Mesrobian, "Preparation, Properties and Structure of Polyhydrocarbons Derived from p–Xylene and Related Compounds," vol. XIII, 1954, pp. 3–20 (no date).

(List continued on next page.)

*Primary Examiner*—Timothy Meeks
*Attorney, Agent, or Firm*—Thomason, Moser & Patterson

[57] ABSTRACT

A method for forming thin polymer layers having low dielectric constants or semiconductor substrates. In one embodiment, the method includes the vaporization of stable di-p-xylylene, the pyrolytic conversion of such gaseous dimer material into reactive monomers, and blending of the resulting gaseous p-xylylene monomers with one or more comonomers having silicon-oxygen bonds and at least two pendent carbon—carbon double bonds. The copolymer films have low dielectric constants, improved thermal stability, and excellent adhesion to silicon oxide layers in comparison to parylene-N homopolymers.

4 Claims, 8 Drawing Sheets

U.S. PATENT DOCUMENTS

| | | | |
|---|---|---|---|
| 5,447,570 | 9/1995 | Schmitz et al. | 118/728 |
| 5,491,112 | 2/1996 | Buchta et al. | 437/225 |
| 5,522,933 | 6/1996 | Geller et al. | 118/723 |
| 5,534,068 | 7/1996 | Beach et al. | 118/719 |
| 5,536,317 | 7/1996 | Crain et al. | 118/664 |
| 5,536,319 | 7/1996 | Wary et al. | 118/719 |
| 5,536,321 | 7/1996 | Olsen et al. | 118/719 |
| 5,536,322 | 7/1996 | Wary et al. | 118/719 |
| 5,536,892 | 7/1996 | Dolbier, Jr. et al. | 570/144 |
| 5,538,758 | 7/1996 | Beach et al. | 426/255.6 |
| 5,554,570 | 9/1996 | Maeda et al. | 437/235 |
| 5,556,473 | 9/1996 | Olson et al. | 118/719 |
| 5,582,866 | 12/1996 | White | 427/248.1 |
| 5,705,726 | 1/1998 | Abichandandi et al. | 585/481 |
| 5,709,753 | 1/1998 | Olson et al. | 118/719 |

OTHER PUBLICATIONS

Andreas Griener, "Poly (1,4–xylylene)s: Polymer Films by Chemical Vapour Deposition," 1997, vol. 5, No. 1, Jan., 1997, pp. 12–16.

L. A. Auspos, Luther A. R. Hall, James K. Hubbard, WM. Kirk, Jr., John R. Schaefgen, and Stanley B. Speck, "Aromatic Polyhydrocarbons. I. Monomer Reactions and Polymer Preparation," vol. XV, 1955, pp. 9–17 (no date).

A. Greiner, S. Mang, O. Schäfer and P. Simon, "Poly(p–xylylene)s: Synthesis, polymer analogous reactions, and perspectives on structure–property relationships," 1997, pp. 1–15 (no month).

A.C. Farthing, "lin–Poly–p–xylylene. Part I. Intermediates and Polymers of Low Molecular Weight", 1953, pp. 3261–3264 (no date).

Dale F. Pollart, "The Synthesis of DI–P–XYLYLENE," Atlantic City Meeting, Sep. 12–17, 1965, 5 pages.

H. Yasuda, "Plasma Polymerization," Academic Press, Inc., 1985 pp. 65–71 (no month).

John R. Schaefgen, "The Pyrolysis of p–Xylene," vol. XV, 1955, pp. 203–219 (no month).

Kelly J. Taylor, Mona Eissa, Justin F. Gaynor, Shin–Puu Jeng, Hoan Nguyen, SPDC, Texas Instruments, Inc., "Parylene Copolymers," vol. 476, pp. 197–205 Jan. 1998.

Justin F. Gaynor, J. Jay Senkevich and Seshu B. Desu, "A new method for fabricating high performance polymeric thin films by chemical vapor polymerization," vol. 11, No. 7, Jul., 1996, pp. 1842–1850.

Justin F. Gaynor and Seshu B. Desu, "Room temperature colpolymerization to improve the thermal and dielectric properties of polyxylylene thin films by chemical vapor deposition," vol. 9, No. 12, Dec., 1994, pp. 3125–3130.

Shin–Puu Jeng, Mi–Chang Chang, Tara Kroger, Peter McAnnly, Robert H. Havemann, "A Planarized Multilevel Interconnect Scheme With Embedded Low–Dielctric–Constant Polymers For Sub–Quarter–Micron Applications," Semiconductor Process and Device Center Texas Instruments, 2 pages (no date).

N. Irving Sax and Richard J. Lewis, Sr., "Hawley's Condensed Chemical Dictionary," 3 pages 1987 p. 876 (no month).

Ashok K. Sharma, "Parylene C at Subambient Temperatures," Journal of Polymer Science: Part A: Polymer Chemistry, vol. 26, 1988, pp. 2593–2971 (no month).

John Wiley & Sons, Inc., "Xylylene Polymers," Encyclopedia of Polymer Science and Engineering, vol. 17, Second Edition, Copyright© 1989, pp. 990–1025 (no month).

Doklady Akademi Nauk SSR, "Proceedings of the Academy of Sciences of the USSR," Doklady Chemistry, Chemistry Section, Consultants Bureau, New York, Russian Original vol. 319, Nos. 1–3, Jul. 1991, pp. 165–168.

S. Dabral, X Zhang, B. Wang, G–R Yang, T–M Lu and J.F. McDonald, "Metal–Parylene Interconnection Systems," Materials Research Society, vol. 381, ©1995, pp. 205–215 (no month).

CHEMICAL VAPOR DEPOSITION OF A COPOLYMER OF P-XYLYLENE AND A MULTIVINYL SILICON/OXYGEN COMONOMER

FIELD OF THE INVENTION

This invention relates to a method for forming a thin polymer layer on a substrate. More, particularly, this invention relates to a method for depositing a layer of a polymeric or polymerizable material having a low dielectric constant on or between metal layers during fabrication of integrated circuits.

BACKGROUND OF THE INVENTION

In the construction of integrated circuits, device geometries are constantly shrinking, resulting in an increase in parasitic capacitance between devices. Parasitic capacitance between metal interconnects on the same or adjacent layers in the circuit can result in crosstalk between the metal lines or interconnects and in a reduction of the response time of the device. Lowering the parasitic capacitance between metal interconnects separated by dielectric material can be accomplished by either increasing the thickness of the dielectric material or by lowering the dielectric constant of the dielectric material. Increasing the thickness of the dielectric materials is, however, contrary to the goal of reducing device and structure geometries.

As a result, to reduce the parasitic capacitance between metal interconnects on the same or adjacent layers, one must change the material used between the metal lines or interconnects to a material having a lower dielectric constant than that of the materials currently used, i.e., silicon dioxide ($SiO_2$), k≈4.0.

Jeng et al. in "A Planarized Multilevel Interconnect Scheme with Embedded Low-Dielectric-Constant Polymers for Sub-Quarter-Micron Applications", published in the Journal of Vacuum and Technology in June 1995, describes the use of a low dielectric constant polymeric material, such as parylene, as a substitute for silicon dioxide ($SiO_2$) between tightly spaced conductive lines or other strategically important areas of an integrated circuit structure. Parylene, a generic name for thermoplastic polymers and copolymers based on p-xylylene and substituted p-xylylene monomers, has been shown to possess suitable physical, chemical, electrical, and thermal properties for use in integrated circuits. Deposition of such polymers by vaporization and decomposition of a stable dimer, followed by deposition and polymerization of the resulting reactive monomer, is discussed by Ashok K. Sharma in "Parylene-C at Subambient Temperatures", published in the Journal of Polymer Science: Part A: Polymer Chemistry, Vol. 26, at pages 2953–2971 (1988). Parylene polymers are typically identified as Parylene-N, Parylene-C, and Parylene-F corresponding to non-substituted p-xylylene, chlorinated p-xylylene, and fluorinated p-xylylene, respectively. Properties of such polymeric materials, including their low dielectric constants, are further discussed by R. Olson in "Xylylene Polymers", published in the Encyclopedia of Polymer Science and Engineering, Volume 17, Second Edition, at pages 990–1024 (1989).

Parylene-N is deposited from non-substituted p-xylyene at temperatures below about 70–90° C. However, the parylene-N films typically do not adhere well to silicon oxide and other semiconductor surfaces. Furthermore, the parylene-N films have poor thermal stability at temperatures above about 400° C., and the films typically are not used in integrated circuits when subsequent processing temperatures will exceed 400° C. Thermal stability and adhesion of parylene films is improved by fluorinating or chlorinating the dimer of p-xylylene to make parylene-F films or parylene-C films. However, the substituted p-xylylene dimers are substantially more expensive than the non-substituted dimer and are more difficult to process. The substituted dimers are typically cracked at temperatures which degrade the substituted p-xylylene monomers, and the parylene-C and parylene-F films must be deposited at temperatures substantially lower than 30° C.

The problems of conventional parylene films have resulted in research regarding copolymers of p-xylylene monomers and other monomers that condense at about the same temperatures at which the p-xylyene monomers condense. Copolymerization of p-xylylene has primarily focused on monovinyl compounds (i.e., one pendent carbon—carbon double bond) to avoid addition of non-polymerized vinyl groups to the polymer. Non-polymerized carbon—carbon double bonds in the parylene-N polymers contribute to the limited thermal stability. Multivinyl monomers typically polymerize through only one vinyl group because remaining vinyl groups are not readily accessed by the same or neighboring polymerization sites. Non-substituted p-xylylene is essentially a divinyl monomer, but substantially polymerizes through vinyl groups at each end of the monomer leaving carbon—carbon double bonds in the center ring portion of the polymerized monomer. Some of the p-xylyene monomer polymerizes through only one vinyl group resulting in more remaining vinyl groups than expected. At temperatures above about 400° C., the remaining vinyl groups may form reactive groups that break down the copolymer structure by a variety of mechanisms.

Copolymerization of p-xylylene is difficult to achieve since both monomers must condense on the substrate and have similar reactivity. Copolymerization of p-xylylene and monovinyl compounds has not resulted in a suitable copolymer film for integrated circuits.

As a result, there remains a need for a process for depositing a low dielectric copolymer on a substrate such as an integrated circuit, the copolymer having increased thermal stability and improved adhesion in comparison to parylene-N films, the copolymer process having controllable process conditions that are suited for integrated circuit processes in comparison to parylene-C and parylene-N films.

SUMMARY OF THE INVENTION

The present invention provides a method and apparatus for depositing a low k dielectric copolymer on a substrate. The copolymer is preferably deposited between metal lines in an interconnect layer and/or between metal interconnect layers in a semiconductor substrate. In particular, a method is provided for depositing a copolymer of p-xylylene and a multivinyl silicon/oxygen comonomer having at least one silicon-oxygen bond and at least two pendent carbon—carbon double bonds. Suitable comonomers which are commercially available include siloxane, oxysilane, siloxy, disiloxane, and cyclosiloxane compounds including, but not limited to, tetraallyloxysilane, tetravinyltetramethylcyclotetrasiloxane, tris(vinyldimethylsiloxy)methylsilane, 1,1,3,3-tetravinyldimethyldisiloxane, 1,3-divinyltetramethyldisiloxane, 1,3-divinyl-1,3-dimethyldiphenyldisiloxane, vinyltriisopropenoxysilane, and 1,3-divinyl-5-triethoxysilylbenzene. The copolymers of the present invention have an unexpectedly low amount of remaining vinyl groups resulting in improved thermal stability. The copolymers also have improved adhesion and reduced dielectric constants in comparison to known p-xylylene films.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE INVENTION

Figure 1:
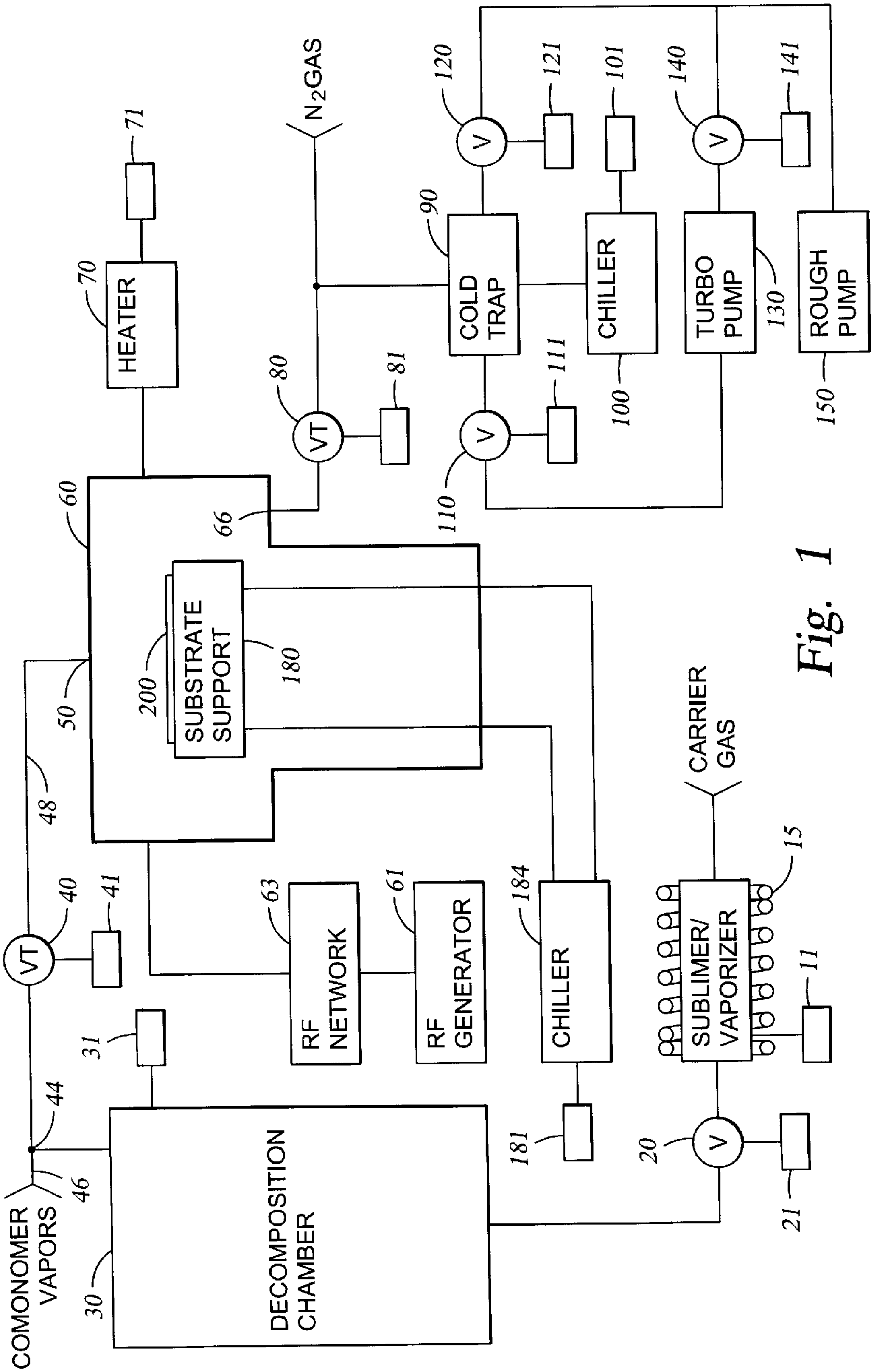
FIG. 1 is a schematic diagram of a copolymer deposition apparatus of the present invention.

The present invention generally comprises a method and apparatus for forming thin copolymers having a low dielectric constant on the surface of a work piece. A processing chamber provides vapor deposition of comonomer vapors onto a substrate and formation of a copolymer film. The copolymer is produced from p-xylylene and a multivinyl silicon/oxygen monomer having at least one silicon-oxygen bond and at least two pendent carbon—carbon double bonds. Suitable multivinyl silicon/oxygen compounds provide copolymers having an unexpectedly low amount of remaining vinyl groups and good adhesion to substrate surfaces. Suitable multivinyl silicon/oxygen monomers that are commercially available include siloxane, oxysilane, siloxy, disiloxane, and cyclosiloxane compounds including, but not limited to, tetraallyloxysilane, tetravinyltetramethylcyclotetrasiloxane, tris(vinyldimethylsiloxy)methylsilane, 1,1,3,3-tetravinyldimethyldisiloxane, 1,3-divinyltetramethyldisiloxane, 1,3-divinyl-1,3-dimethyldiphenyldisiloxane, vinyltriisopropenoxysilane, and 1,3-divinyl-5-triethoxysilylbenzene. Experimental results establish that two or more pendent carbon—carbon double bonds in the comonomers of the present invention are substantially polymerized. Tetraallyloxysilane results in substantial polymerization of at least three of the four pendent carbon—carbon double bonds, and also provides a copolymer having a significant and unexpected reduction in dielectric constant.

The present invention further provides a method for forming a copolymer between metal interconnects and between layers of metal interconnects on a substrate. In particular, an apparatus and method is provided for the deposition of polymeric or polymerizable material preferably having a dielectric constant lower than that of silicon dioxide as well as suitable physical, chemical, electrical and thermal properties for use on integrated circuits in accordance with the present invention. In one embodiment, the method and apparatus specifically provides for continuous introduction of p-xylylene, a multivinyl silicon/oxygen monomer, and a carrier gas into a processing chamber, such as a CVD or plasma etch chamber, operated at a total pressure from abiut 30 mtorr to about 5 Torr, and condensation of both monomers onto a substrate to form a parylene copolymer thereon having a thickness from about 0.05 micron to about 150 microns.

An apparatus used to deposit the copolymer specifically includes a deposition chamber for depositing a thin copolymer onto an object as described below. The copolymer process is preferably incorporated into a computer controlled multi-chamber integrated processing system such as the Endura™ or Centura™ processing systems available from Applied Materials, Inc., of Santa Clara, Calif.

As used herein, the term "parylene" is the generic name for thermoplastic polymers based on p-xylylene ($CH_2C_6H_4CH_2$) or derivatives of p-xylylene. The p-xylylene polymers have the formula:

$$—(CH_2—C_6H_4—CH_2—)_n—$$

wherein n is the average number of monomer units in a molecule. Although not directly measured, n has been estimated to average about 5,000 in a typical parylene-N film, which gives the parylene-N film an estimated number average molecular weight of about 500,000. Actual molecular weights are expected to have a broad distribution and the actual molecular weights are considered to be unmeasurable. The copolymer grows by addition of monomers on both ends of a p-xylylene initiator and the copolymer molecules have end groups which are not easily identified. It is believed that the end groups have no influence on properties. The term "parylene" also includes chlorinated or fluorinated forms of the p-xylylene polymers produced by halogenating the monomers or the polymers.

Deposition System

The copolymers of the present invention are deposited by system hardware that converts solid or liquid monomers to gases, introduces the gases to a chamber containing a substrate, and exhausts the remaining gases from the chamber.

Referring to FIG. 1, in one embodiment, a vaporizer 10 is provided to heat and vaporize or sublime a monomer such as di-p-xylylene or a di-p-xylylene derivative. A heated pressure gauge (not shown), such as one available from Baratron, can be located in the vaporizer to monitor the pressure of the vaporizer to insure that a continuous feed of particulate solid or liquid dimer is provided to the vaporizer 10. The pressure gauge is preferably heated so that material will not deposit on the gauge and render the gauge inoperable.

The vaporized dimer, such as di-p-xylylene, or optional mixture of vaporized dimer and a carrier gas, then passes from vaporizer 10 through a gate valve 20 to a pyrolysis or decomposition chamber 30 where the vaporized dimer is at least partially decomposed to a reactive monomer, such as p-xylylene. It should be recognized that when the starting polymerizable material is a monomer or oligomer that does not require vaporization or decomposition to produce a reactive species, then the vaporization and decomposition chambers may be removed or bypassed.

Figure 2:
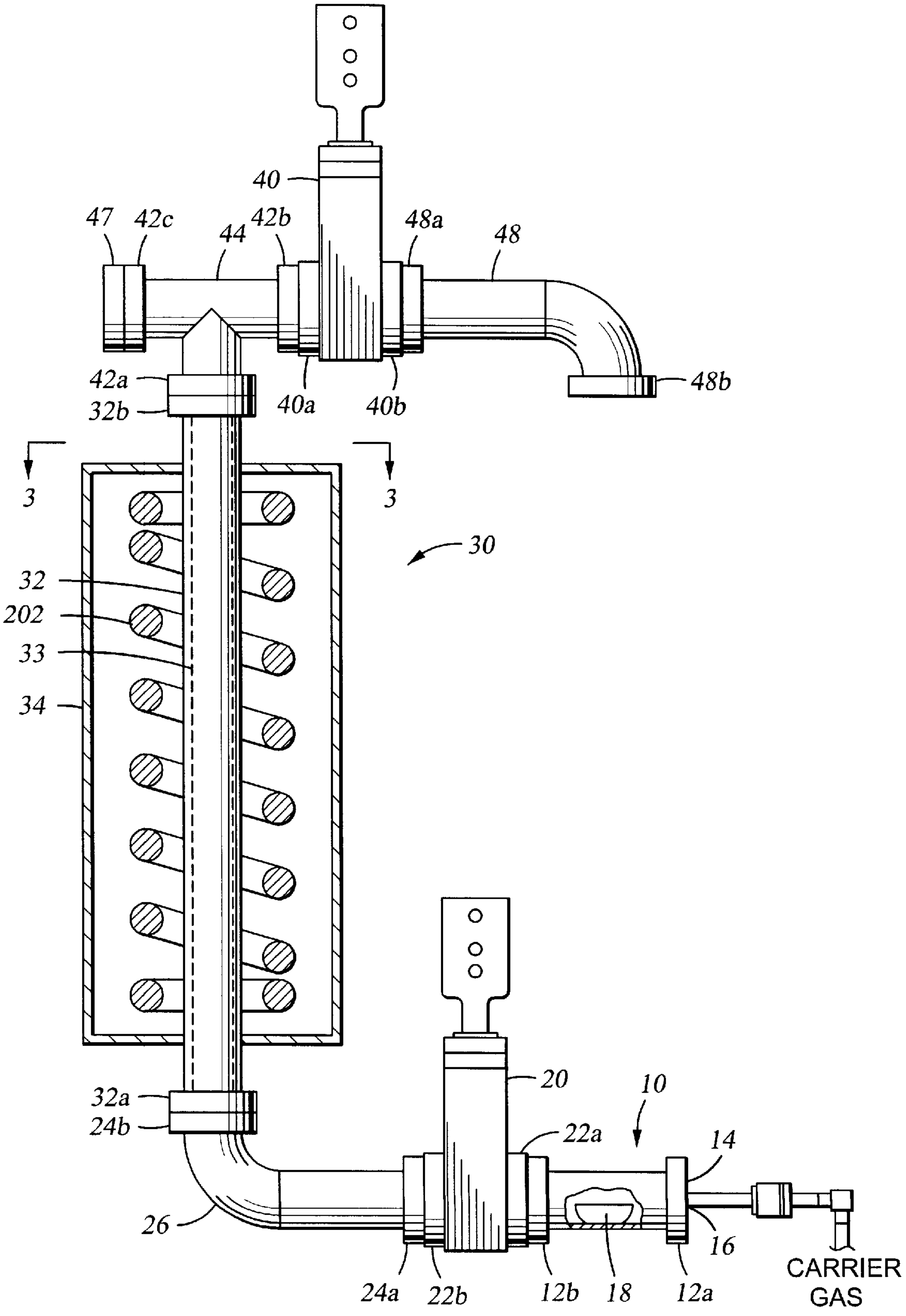
FIG. 2 is a partially sectioned view of a portion of the apparatus of FIG. 1, showing a vaporizer, a decomposition chamber, and a manifold for feeding reactive vapors into the deposition chamber.

Referring now to FIGS. 1 and 2, the vaporizer 10 is shown for heating the starting material to vaporize or sublime a liquid or solid polymerizable material before introducing it into the decomposition chamber 30 or blending it with the comonomer. Vaporizer 10 may comprise a metal cylinder comprising stainless steel or aluminum, having metal flanges 12*a* and 12*b* thereon. Metal flange 12*a* has a cover 14 thereon which is provided with a gas inlet port 16 to permit the flow of a non-reactive gas into the vaporizer 10. Flange 12*b*, which comprises the exit port of the vaporizer 10, is bolted to a matching flange 22*a* of gate valve 20 which separates the vaporizer 10 from decomposition chamber 30.

Within the vaporizer 10 is a containment vessel 18 for placement of polymerizable starting material, such as di-p-xylylene. Containment vessel 18, which may rest on the inner surface of the vaporizer 10, is made of a non-reactive material, usually a ceramic material, and preferably comprises quartz. As an option, containment vessel 18 may be further provided with a number of openings (not shown) in the upper half of the vessel to facilitate flow of heated gases into and out of containment vessel 18 to assist in the vaporization of the solid p-xylylene dimer and entrainment of the dimer vapors in the carrier gas flow.

The pressure in vaporizer 10 may be maintained at atmospheric pressure. However, the entire apparatus (vaporization, decomposition, and deposition chambers) is preferably maintained at a pressure from 5 milliTorr to about 5 Torr. For non-substituted di-p-xylylene, the pressure will preferably range from about 100 milliTorr to about 5 Torr. The higher total pressures increase the deposition rate of the polymers and allow better control of the amount of monomer or polymer that is provided to the deposition chamber. Total pressure can be increased by adding carrier gases without increasing the amount of the monomers. The carrier gas can be any inert gas, preferably helium, argon, or nitrogen, preferably helium.

Referring to FIGS. 1 and 2, the vaporizer 10 may be heated by any convenient means such as, for example, a heating coil 15 which may be wrapped around the vaporizer 10 to heat the same. The heating coil, in turn, is connected to an external electrical power source 11, which is adjustable to provide sufficient heat to vaporizer chamber 10 to heat it to the vaporization temperature of the polymerizable material therein, but below a temperature at which the material will decompose into the reactive monomer. An external heat controller, such as a Watlow 965 Temperature Controller, may be used in connection with the heating coil to maintain the desired temperature.

The temperature of vaporizer 10, when operated within the previously described pressure ranges, will usually vary from a minimum temperature below which the material will not vaporize, at the pressure required for deposition, up to a maximum temperature below the temperature at which the vaporized material will decompose, at the operative pressure. While the operating temperature of the vaporizer will vary according to the material to be vaporized, the temperature is preferably maintained between about 100° C. and about 200° C.

The carrier gases, such as helium, are optionally introduced into the vaporizer 10 through gas inlet port 16 in cover 14, and are then heated by the vaporizer 10 and passed through the gate valve 20 to a decomposition chamber 30. However, it should be recognized that the process may be carried out using only the vaporized monomers, e.g., p-xylylene dimer, without the use of a carrier gas.

Figure 12:
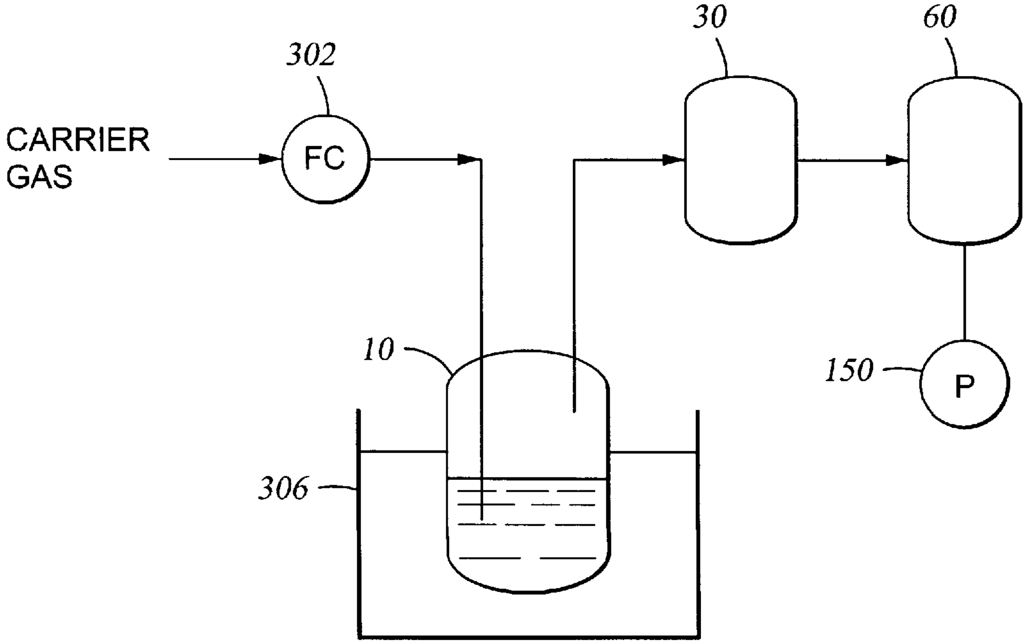
FIG. 12 is a schematic view of a carrier gas delivery system for transporting a polymerizable material from a vaporizer to a decomposition chamber.

An alternative embodiment for the vaporizer 10 is shown in FIG. 12 wherein a thermostatic oven 306 heats the vaporizer 10 which contains, for example, non-vaporized di-p-xylylene and vaporized di-p-xylylene. The carrier gas is passed through a flow controller 302 such as a metering pump or a needle valve and is bubbled through the non-vaporized di-p-xylylene in the vaporizer 10. The combined carrier gas and vaporized di-p-xylylene from the vaporizer 10 are then passed to the decomposition chamber 30 and then the deposition chamber 60 where residual gases are exhausted by a rough pump 150. A mass flow meter (not shown) can be placed anywhere between the vaporizer 10 and the deposition chamber 60 to measure the total mass leaving the vaporizer 10. The flow rate of di-p-xylylene can then be calculated by subtracting the mass of carrier gas sent to the vaporizer 10 from the mass of material leaving the vaporizer 10.

Referring to FIGS. 1 and 2, the first valve 20 following the vaporizer 10 may be manually operated, but preferably will be automatically operated and connected to a valve controller 21 which monitors the temperature and pressure in vaporization chamber 10 and opens valve 20 only after vaporization chamber 10 has reached a temperature at which the polymerizable material will vaporize so that gases flowing from vaporization chamber 10 through the first valve 20 contain vaporized polymerizable material, as well as the optional non-reactive carrier gases flowing through vaporization chamber 10. A second flange, 22*b*, connects first valve 20 to a first flange 24*a* on a conduit 26 having a second flange 24*b* at its opposite end connected to a first flange 32*a* of decomposition chamber 30.

Flanged metal conduit 26, is preferably heated by an external heater such as heating tape (not shown) wrapped around conduit 26 to maintain the reactive monomer at a temperature sufficiently high so that it will not begin to polymerize. Typically, this will be a temperature of at least about 120° C.

When decomposition of the vaporized polymerizable starting material is necessary to form a reactive monomer, such as when using di-p-xylylene, the vapors from the vaporization chamber 10 are preferably sent to a decomposition chamber 30. While the decomposition chamber 10 may be constructed in many ways, it is preferred that the chamber have a large surface area to heat the vaporized material rapidly and evenly. In one embodiment, the decomposition chamber 30 comprises a metal cylinder wall 32 terminating, at one end, in first flange 32*a* through which it is connected, via conduit 26, to first gate valve 20, which is used to control the flow of the vapors of the dimer entering the decomposition chamber 30. The inner surface of metal cylinder 32 may be optionally lined with quartz, as shown at 33, to avoid contamination of the reactive p-xylylene vapors at the temperature used to decompose the dimer.

Surrounding metal cylinder 32 is a cylindrical ceramic furnace 34, having heater wires 202 therein to heat the cylinder 32. An outer layer of perforated metal (not shown) may optionally surround ceramic furnace 34 to serve both as a shield to avoid contact by the operator, with the hot ceramic furnace, as well as to permit the flow of air between the metal shield and ceramic furnace 34.

The heater wires 202 of the ceramic furnace 34 are connected to an external power supply (not shown) and a temperature controller 31 to maintain a temperature between about 400° C. and about 1000° C., preferably above 700° C. A temperature above 400° C. and preferably above about 700° C., is necessary to assure sufficient decomposition of the stable dimer into the reactive monomer, while the maximum temperature should not exceed about 1000° C. to avoid decomposition of the monomer formed in the decomposition chamber 30. It should again be recognized that the decomposition temperature will vary according to the dimer material being used.

It is preferred that the decomposition chamber 30 decompose a sufficient amount of the dimer during its passage through cylinder 32 to form the reactive monomer to prevent the deposition of unwanted particles on the substrate surface or the formation of lumps in the deposited coating. Dimer that has not been decomposed will not polymerize, and may, therefore, cause lumps in the coating as it deposits on the substrate, cause unwanted particles on the surface, or pass through the deposition chamber and clog the cold trap mechanism 90 located downstream of deposition chamber 60 ahead of rough vacuum pump 150.

It should be noted that the use of first gate valve 20 and second gate valve 40, both preferably computer controlled, allows both the vaporizer 10 and decomposition chamber 30 to be isolated from deposition chamber 60 while the substrate is removed from the deposition chamber. That is, the whole system need not be shut down during movement of a substrate into the deposition chamber to be coated, or out of the deposition chamber after the deposition. The operation of the entire system, including the heater power sources 11, 31, valve controllers 21, 41, 81, 111, 121, 141, heater controller 71, and chiller controllers 101, 181, is preferably controlled by the computer control means 340 shown in FIG. 6.

To ensure a high level of decomposition of the stable dimer vapors, it is preferred that the dimer vapor be sufficiently heated in the decomposition chamber 30. This can be accomplished either by increasing the surface area of cylinder 32 in decomposition chamber 30 in contact with the vaporized dimer, or by extending the residence time of the vaporized dimer in decomposition chamber 30, or by a combination of both. Typically, the residence time of the vaporized dimer in the decomposition chamber is 1–5 minutes. These operations also can all be controlled by control means 340. To enhance decomposition of the dimer to reactive monomer, a plasma may be established in the deposition chamber 60 by conventional methods to provide sufficient heat to decompose any stable precursor material into reactive material.

Figure 3:
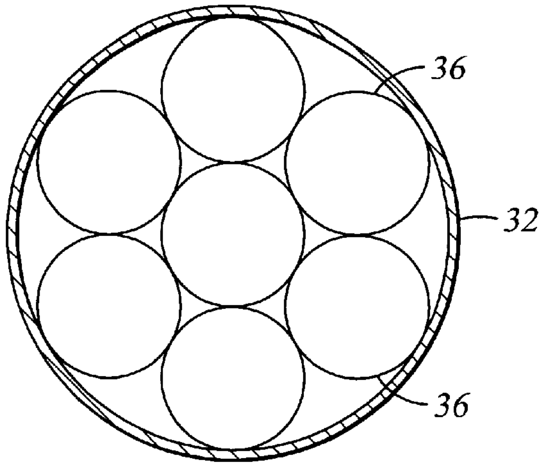
FIG. 3 is a horizontal cross-sectional view of the decomposition chamber shown in FIGS. 1 and 2, showing the hollow tubes placed within the decomposition chamber to increase the surface area in contact with the vapors and gases passing through the chamber.

Referring now to FIG. 3, a cross-sectional view of the preferred decomposition chamber of FIG. 2, shows that metal cylinder 32 has been loaded or packed with a series of hollow tubes 36, each having its axis parallel to the center axis of metal cylinder 32. Tubes 36 are packed sufficiently tightly within cylinder 32 so as to be in thermal communication with one another so that each tube 36 is at the temperature of the wall of cylinder 32. The presence of tubes 36 within cylinder 32 therefore serve to greatly increase the surface area within cylinder 32 in contact with the vaporized monomer. Thus, the vaporized dimer is channeled through or in between tubes 36 so that the vaporized dimer is uniformly heated to the decomposition temperature, thus maximizing the amount of the dimer decomposed to the reactive monomer. Preferably, each hollow tube 36 is made of quartz, or at least has quartz surfaces thereon. Preferably, when the inner diameter (ID) of cylinder 32 ranges from about 1.5 to about 2 inches, small tubes 36 will each have an outer diameter (OD) of from about 0.3 to about 0.5 inches, and a wall thickness of about 0.050 inches, resulting in an ID of from about 0.2 to about 0.4 inches.

The residence time of the dimer in the decomposition chamber may be controlled by regulating the flow rate of vaporized dimer into decomposition chamber 30, such as by regulating the flow of carrier gas into vaporization chamber 10; by throttling gate valves 20 and 40; or by a combination of such valve throttling and carrier gas flow rate control, under the control of controller 340. The residence time can also be controlled by the length of decomposition chamber 30, i.e., by lengthening metal cylinder 32, and/or by increasing the mean path length within cylinder 32 by the placement of flow redirecting elements within cylinder 32, as will be described below.

Figure 4:
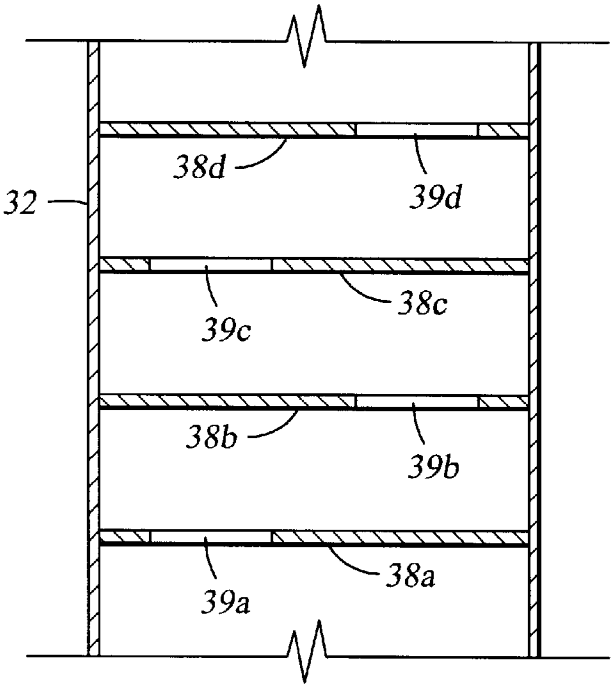
FIG. 4 is a vertical cross-sectional view of an alternate structure for the decomposition chamber of FIGS. 1 and 2, using a series of discs with non-aligned holes therein.
Figure 5:
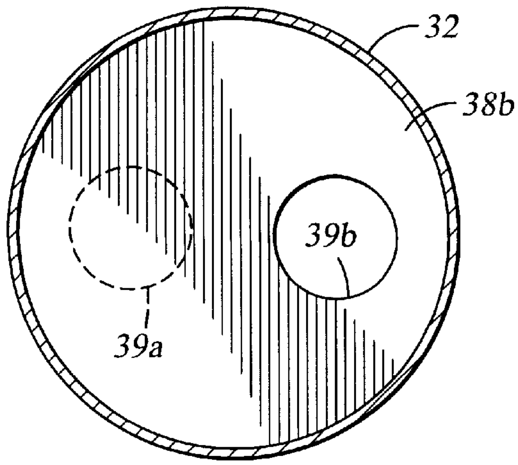
FIG. 5 is a top view of one of the discs shown in FIG. 4, showing the misalignment of the opening therein with the opening of an underlying disc.

Referring now to FIGS. 4 and 5, another embodiment of a decomposition chamber is shown comprised of a series of circular discs 38*a–d* placed in spaced apart relationship in cylinder 32, with the plane of each disc perpendicular to the center axis of cylinder 32. Each disc is provided with an opening through which the carrier gas/vaporized dimer mixture flows. However, as best seen in FIG. 4, openings in adjacent discs are deliberately misaligned to extend the length of travel of the gaseous mixture through cylinder 32. Thus, opening 39*b* in disc 38*b* shown in FIG. 4 is axially misaligned to the underlying opening 39*a* in disc 38*a* beneath disc 38*b*. This embodiment actually acts to both increase the residence time (by increasing the length of the path of flow), and also to increase the contact area within cylinder 32 which comes in contact with the gaseous mixture, since the surface of each disc 38*a–d,* which will be at the same temperature as cylinder 32, will also be in contact with the gaseous mixture.

As further shown in FIGS. 1 and 2, the gases flowing from decomposition chamber 30 pass into a metal tee 44, wherein the reactive monomer gases may be optionally blended with other copolymerizable materials, i.e., monomers or dimers with which the reactive parylene monomers will react and polymerize in the deposition chamber, as will be described below. A second flange 32*b* on the opposite end of cylinder 32 is connected to a first flange 42*a* of tee 44 to provide the connection between decomposition chamber 30 and tee 44. A second flange 42*b* of tee 44 is secured to a first flange 40*a* on second gate valve 40, which is operated by valve controller 41 and computer control means 340 to control the flow of vapors into deposition chamber 60, as will be described below.

Third flange 42*c* of tee 44 is either secured to a flange (not shown) of conduit 46 (shown in FIG. 1) leading to a vaporized source of a copolymer to be mixed in tee 44, with the vaporized parylene monomer or, as shown in FIG. 2, a cap or cover 47 may be secured to flange 42*c* when no separate source of copolymer vapors are mixed with the reactive monomer from the decomposition chamber.

Tee 44, like flanged metal conduit 26, is preferably heated by an external heater such as heating tape wrapped around tee 44 to maintain the reactive monomer at a temperature sufficiently high so that it will not begin to polymerize. Usually this will comprise a temperature of at least about 150° C. When a copolymerizable source is used, a second vaporization chamber, similar to the previously described vaporization chamber 10, can be used to vaporize the copolymerizable material. If necessary, further apparatus forming a decomposition chamber similar to previously described decomposition chamber 30 may also be used. In either case, the apparatus used to provide such a copolymerizable material in gaseous form may then be connected to flange 42*c* of tee 44 to thereby permit the respective gaseous reactive copolymerization sources to blend together in tee 44 prior to introduction into deposition chamber 60.

The gas/vapor flow containing the active p-xylylene monomer then passes out of decomposition chamber 30 to a tee 44 having flanges 42*a–c* where it is blended with comonomer, in vaporized form, from conduit 46 (shown in FIG. 1). The multivinyl silicon/oxygen compounds such as tetraallyloxysilane are readily vaporized using a vaporizing injection system available from Precision Liquid Injection System, Inc. The vaporized monomer and comonomer then flow through a second gate valve 40 having flanges 40*a,* 40*b* to a conduit 48 which connects valve 40 with an entrance port 50 to a substrate processing chamber 60 where the monomers deposit and polymerize on an object therein, such as a semiconductor substrate, which is preferably temperature controlled by a support member 180 that is connected to a chiller 184. Condensation of the monomers on the substrate typically occurs at a temperature between 30 and −30° C.

It is preferred that the walls of deposition chamber 60 be maintained at a sufficiently high temperature to prevent deposition and polymerization of the vaporized polymerizable material. In one embodiment, the chamber wall temperature is maintained by a heater 70, under the control of heater controller 71. The remaining gas/vapor mixture then passes from the deposition chamber 60 through a throttle valve 80, under the control of valve controller 81, which regulates the pressure in chamber 60, and then passes through a cold trap 90 connected to a chiller 100. The remaining gases then pass through a gate valve 120, controlled by valve controller 121, to a rough pump 150. It is anticipated that the chamber walls may be heated by any other heating means, including the use of a plasma generated within the chamber itself.

Figure 6:
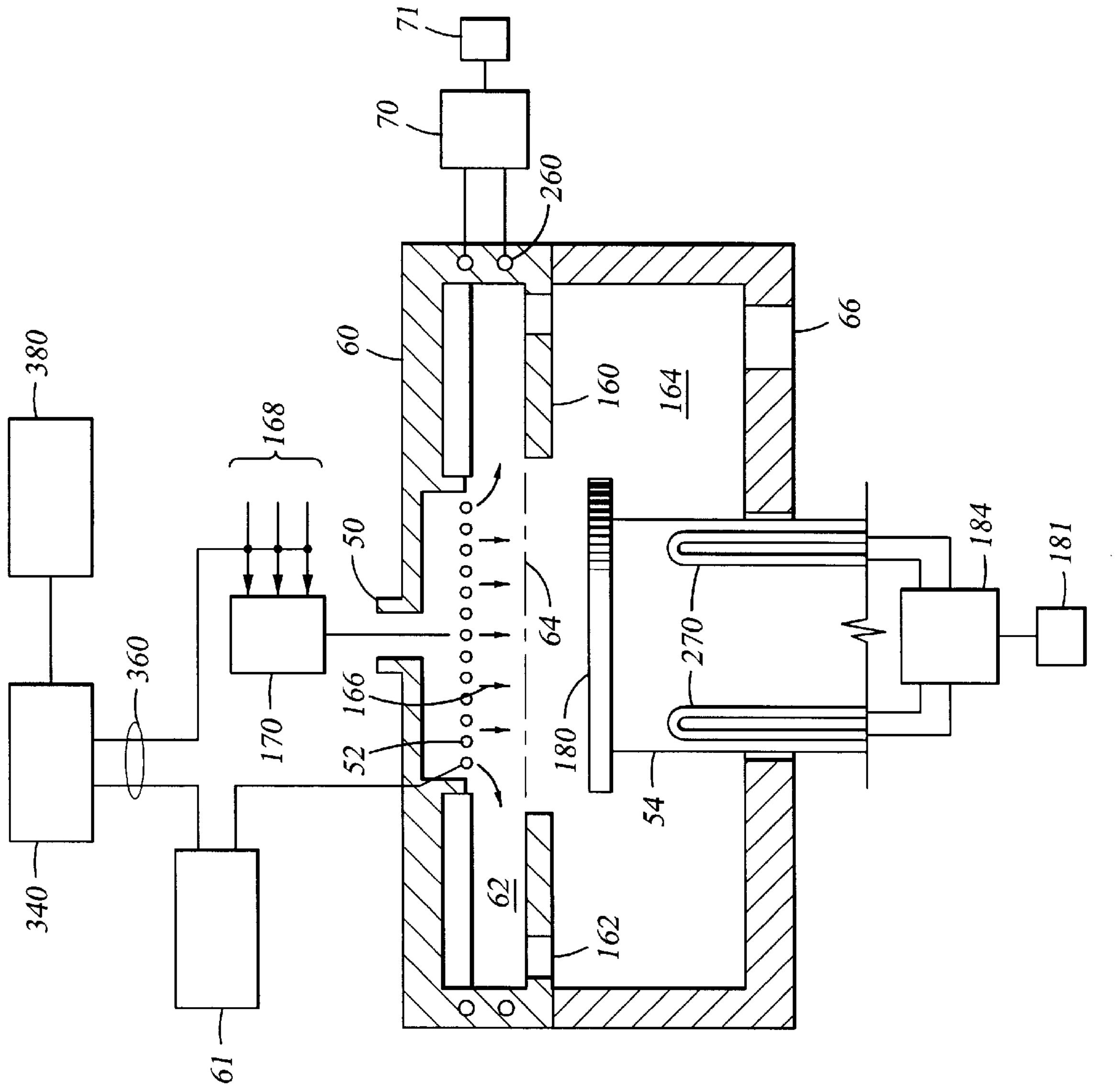
FIG. 6 is a cross-sectional diagram of an exemplary CVD processing chamber used according to one embodiment of the present invention.

In one embodiment shown in FIGS. 1 and 6, the apparatus may be provided with an RF generator 61 which is coupled to chamber 60 through an RF network 63 to permit generation of a plasma within chamber 60 between parallel plates, i.e. a gas distribution plate 52 and a substrate holder 180. The plasma may be used to enhance the decomposition of stable precursors by generating enough heat to convert the stable dimer into the reactive species. The plasma may also provide sufficient heating of the chamber walls to prevent polymerization thereon and/or sufficient heating of the process gases to prevent polymerization in the gas phase. In addition, the RF generator enables integration of the chamber so that either etching of the substrate or in situ cleaning of chamber 60 can be performed.

It is contemplated that the chamber may include an electric bias to control the structure of the deposited copolymer. Specifically, a B field may assist in making an amorphous copolymer.

Process Description

The copolymers of the present invention are generally prepared by condensing p-xylylene and a suitable comonomer on the surface of a substrate under conditions which polymerize both monomers. The silicon/oxygen containing monomers of the present invention provide silicon-oxygen bonds which remain in the copolymer. The relative amount of silicon-oxygen bonds in the copolymer depends on the relative reactivity of the monomers and the structure of the silicon/oxygen monomer.

The typical starting material for making parylene polymers is a stable cyclic dimer, di-p-xylylene, or halogenated derivative, which is available in solid form. The dimer is typically vaporized or sublimed at a temperature between about 100 and about 200° C., and then decomposed to the reactive monomer at a temperature between about 600 and about 1000° C. for the polymerization to proceed. The dimer is commercially available from companies such as Specialty Coating Systems, Inc. Usually the solid dimer is available in particulate form, e.g., in powder form, for ease of handling. However, it is contemplated by the present invention that dimer pellets may be used in conjunction with a packed bed or that the solid precursor material may be liquefied or dissolved in a carrier fluid to facilitate continuous delivery of the dimer.

The amount of comonomer blended with the gaseous flow of p-xylylene monomer and carrier gas may range from about 5% by wt. to about 25% by wt. of the total mixture of monomers, but preferably will range from about 5% by wt. to about 15% by wt., with the typical amount of copolymerizable monomer added usually comprising at least 10% by wt. of the monomer mixture total.

Referring again to FIGS. 1 and 2, tee 44 is connected to second gate valve 40, through flanges 42*b* and 40*a,* respectively, and second gate valve 40 is connected to a further heated conduit 48 through flange 40*b* on gate valve 40 and flange 48*a* on conduit 48. As described above, with respect to conduit 26 and tee 44, conduit 48 is preferably heated, for example by heating tape, to avoid condensation therein. Heated conduit 48 is, in turn, connected via flange 48*b* to entrance port 50 of processing chamber 60.

The deposition chamber 60 is preferably configured for use on an integrated platform for processing integrated circuits. Such an integrated platform is described in Maydan et al., U.S. Pat. No. 4,951,601, the disclosure of which is hereby incorporated by reference. For parylene deposition, internal surfaces of the chamber 60 are maintained or a temperature above the polymerization temperature of the reactive parylene monomer, i.e., at a temperature above 200° C., but below a temperature at which further decomposition of the reactive monomer might occur, i.e., at a temperature below about 750° C. Typically, the temperature of the chamber 60 will be maintained within a range of from about 200° C. and about 300° C.

One suitable CVD processing chamber in which the method of the present invention can be carried out is shown in FIG. 6, which is a vertical, cross-sectional view of a simplified, parallel plate chemical vapor deposition processing chamber 60 having a vacuum chamber 62. Chamber 60 contains a gas distribution manifold 52 for dispersing process gases through perforated holes in the manifold to a wafer 200 (see FIG. 1) that rests on a substrate support member 180. The process and carrier gases (if any) are input through the gas lines 168 into a mixing system 170 where they are combined and then sent to the gas distribution manifold 52. Generally, the process gases supply lines for each of the process gases include (i) safety shut-off valves (not shown) that can be used to automatically or manually shut-off the flow of process gas into the chamber, and (ii) mass flow controllers (also not shown) that measure the flow of gas through the gas supply lines. When toxic gases are used in the process, the several safety shut-off valves are positioned on each gas supply line in conventional configurations.

Substrate support member 180 is highly thermally responsive and is mounted on a pedestal 54 so that support member 180 (and the wafer supported on the upper surface of support member 180) can be controllably moved between a lower loading/off-loading position and an upper processing position 64, which is closely adjacent to manifold 52.

Referring to FIG. 6, when support member 180 is in the upper processing position 64, it is surrounded by a baffle plate 160 having a plurality of spaced holes 162 which exhaust into an annular vacuum manifold 164. During processing, gas inlet to gas distribution manifold 52 is uniformly distributed radially across the surface of a wafer 200 (see FIG. 1) positioned on the support member 180 as indicated by arrows 166 (see FIG. 6). An exhaust system then exhausts the gas via ports 162 into the annular vacuum manifold 164 by a vacuum pump system shown in FIG. 1.

Referring now to substrate support member 180 in FIG. 1, the movable substrate support member may need to be heated or cooled during the process. To condense the monomers on the substrate during the process, the substrate support 180 is maintained at a temperature below the condensation temperature of the monomer, e.g., for p-xylylene the substrate support 180 should not exceed about 40° C. The substrate support 180 is preferably cooled to a temperature within a range of from about −40° C. to about +25° C., using chiller 184 under control of chiller controller 181. The chiller 184 flows a coolant, such as a 1:1 mixture by weight of ethylene glycol and deionized water, through passages 270 (see FIG. 6) in the substrate support 180. When the gaseous mixture contacts the cooled surface of, for example, semiconductor substrate 200, polymerization of the reactive p-xylylen monomers commences, as well as copolymerization with other reactive polymerizable materials (if present) resulting in the formation of the desired dielectric film of parylene or parylene copolymer on the surface of the substrate, e.g., on the surface of semiconductor wafer 200.

To prevent deposition of parylene films on the chamber walls, the heater 70 preferably provides a heat exchange fluid, such as a 1:1 mixture by weight of ethylene glycol and deionized water, through passages 260 in the chamber sidewalls.

Figure 9:
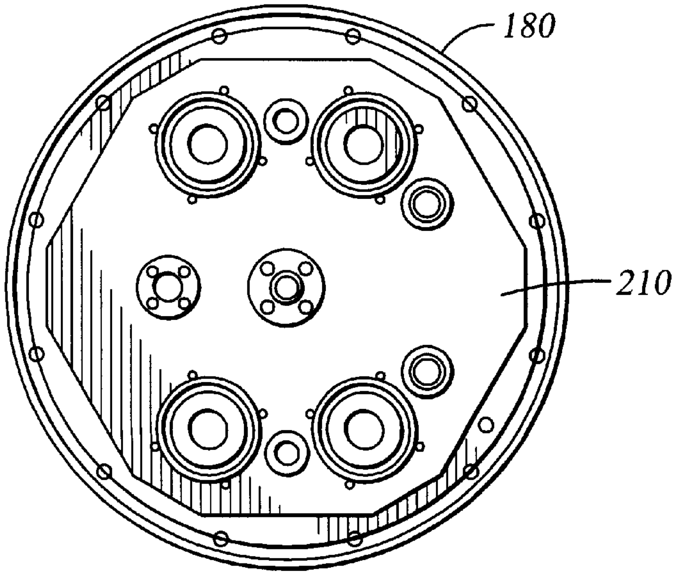
FIG. 9 is a top view of the wafer support mechanism of FIG. 6.

The substrate may be retained on the substrate support 180 by any conventional substrate retention means such as a bipolar or monopolar electrostatic chuck 210, portions of which are shown in FIG. 9. A backside gas such as helium is preferably flown through channels provided in the upper surface of the electrostatic chuck to facilitate heat transfer between the substrate support member 180 and a substrate located thereon for processing and to prevent deposition of the reactive materials onto the edge and backside of the substrate.

The deposition process performed in chamber 60 can be either a thermal process or plasma enhanced thermal process. In a plasma process, a controlled plasma is formed adjacent to the wafer by RF energy applied to gas distribution manifold 52 from RF power supply 61 (with substrate support member 180 grounded). RF power supply 61 can supply either single or mixed frequency RF power to manifold 52 to enhance the decomposition of reactive species introduced into chamber 60. A mixed frequency RF power supply typically supplies power at a high RF frequency (RF1), e.g., 13.56 MHz, and at a low RF frequency (RF2), e.g., 360 KHz.

Typically, any or all of the chamber lining, gas inlet manifold faceplate, and various other reactor hardware is made out of material such as aluminum or anodized aluminum. An example of such a CVD apparatus is described in U.S. Pat. No. 5,000,113, entitled “Thermal CVD/PECVD Reactor and Use for Thermal Chemical Vapor Deposition of Silicon Dioxide and In-situ Multi-step Planarized Process,” issued to Wang et al, and assigned to Applied materials, Inc., the assignee of the present invention. The disclosure of the ’113 patent is incorporated by reference.

Gas mixing system 170 and RF power supply 61 are controlled by the computer control means 340 over control lines 360. The chamber includes analog assemblies such as mass flow controllers (MFCs) and RF generators that are controlled by the control means 340 which executes system control software stored in a memory 380, which, in the preferred embodiment, is a hard disk drive.

Now referring to FIG. 1, after the mixture of vaporized gases and optional carrier gases flow into chamber 60, a parylene copolymer, for example, is deposited on the surface of substrate 200 by condensation and polymerization of the reactive p-xylylene monomers and the multivinyl silicon/oxygen comonomers. The monomers polymerize on the surface of the substrate at different rates depending on the relative concentrations and relative polymerization reaction rates of the monomers. The remainder of the optional carrier gases, and any remaining unreacted monomer vapors, then pass out of chamber 60 through an exit port 66 (see FIG. 10) and then through a throttle valve 80 to a cold trap 90. The purpose of throttle valve 80 is to maintain the desired pressure within chamber 60. The deposition/polymerization reaction is usually carried out while maintaining a pressure within deposition chamber 60 of from about 5 milliTorr (mmTorr) to about 5 Torr. When the pressure in deposition chamber 60 deviates from the set pressure, throttle valve 80, which is computer controlled, either opens to cause the pressure to drop, or closes to cause the pressure to rise.

Figure 10:
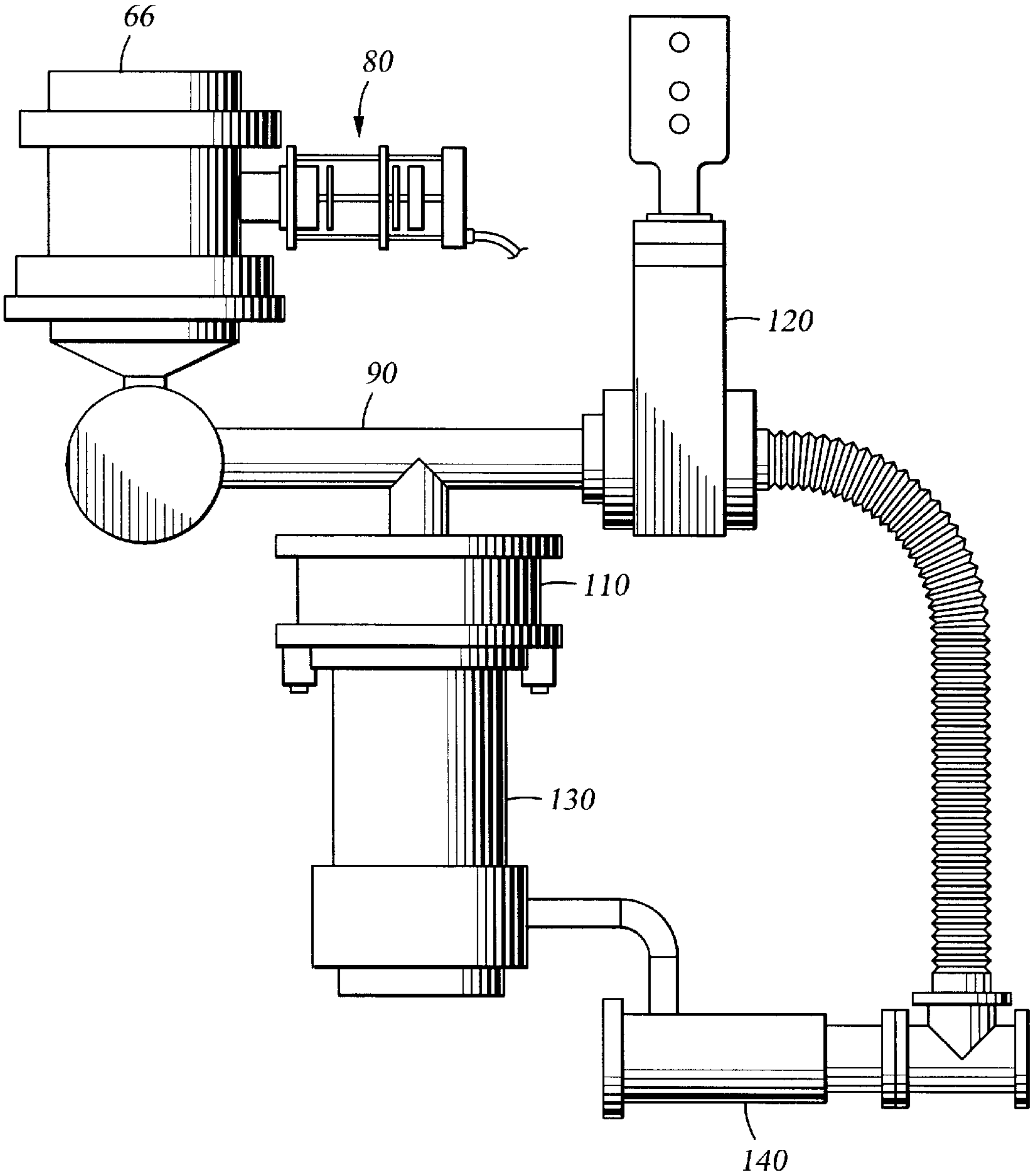
FIG. 10 is a vertical cross-sectional view of a portion of the apparatus generally shown in FIG. 1, showing the processing of gases/vapors exiting from the processing chamber.
Figure 11:
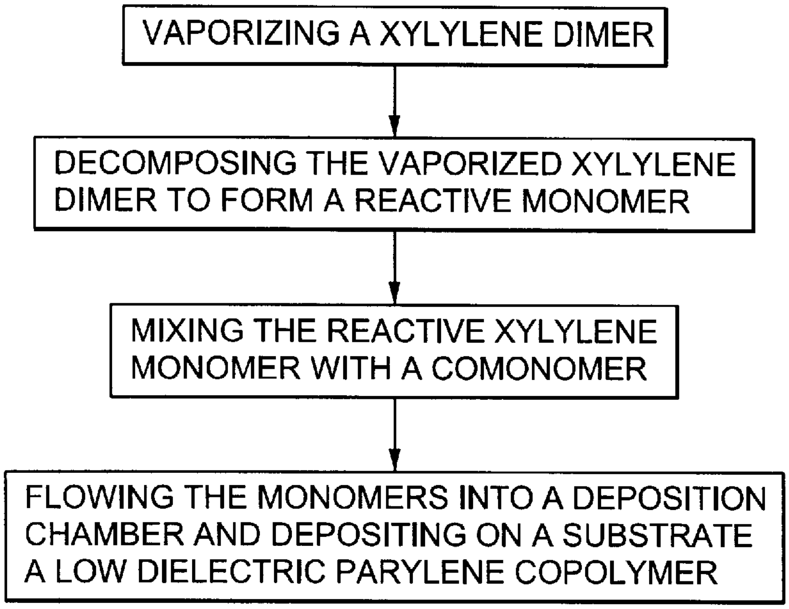
FIG. 11 is a flow sheet illustrating a process according to one embodiment of the present invention.

Now referring to FIG. 10, throttle valve 80 may be modified, if desired, to permit a non-reactive gas, e.g., argon, helium, or nitrogen, to be added to the gaseous stream flowing from chamber 60 through throttle valve 80 to cold trap 90. Typically, this additional gas flow into cold trap 90 will comprise a flow of about 50 standard cubic centimeters per minute (sccm), depending on the chamber volume under the control of controller 340. The purpose of the added non-reactive gases is to control and the flow of the gaseous stream of carrier gas and reactive monomer through deposition chamber 60, i.e., to increase the residence time, to permit more complete extraction of the heat from the gaseous stream flowing through chamber 60 and to provide for more complete reaction of the polymerization, i.e., to further minimize the amount of unreacted polymerizable material leaving chamber 60 via exit port 66 which must be extracted in cold trap 90.

The vapors and gases passing through throttle valve 80 then enter cold trap 90 which, in turn, is connected to a vacuum pump 150 (see FIG. 1) which is capable of maintaining chamber 60 at subatmospheric pressure. It is important, however, that unreacted monomer and other copolymerizable materials not enter vacuum pump 150, but rather be removed from the gas stream in cold trap 90. Cold trap 90 may comprise any conventional commercial cold trap, such as, for example, a standard Norcal cold trap, which is connected to the downstream side of throttle valve 80 to trap and remove any monomers or polymers from the gas stream.

Connected to the downstream side of cold trap 90 is gate valve 120 through which the remaining gases in the gas stream pass to rough vacuum pump 150 to maintain the desired low pressure. As shown in FIGS. 1 and 10, cold trap 90 is also connected through gate valve 110 to a turbo pump 130 and then through an isolation valve 140 to rough vacuum pump 150. When chamber 60 is used as a deposition chamber, such as for the previously discussed polymeric deposition of reactive p-xylylene monomer, valves 110 and 140 are shut and valve 120 is opened to connect rough vacuum pump directly to cold trap 90. However, if the same chamber is to be used as a plasma etch chamber or for any other processing requiring high vacuum, such as for in situ plasma cleaning of the chamber, as previously discussed, gate valve 120 may be shut off and both gate valve 110 and isolation valve 140 opened to place high vacuum turbo pump 130 in the stream between cold trap 90 and rough vacuum pump 150.

To clean the chamber following deposition of reactive monomer, ozone is flown into the chamber at a rate of 1000 sccm. It is believed that the reactive ozone reacts with the parylene to facilitate removal of the parylene from the chamber. In addition to ozone, oxygen can be introduced into the chamber at a rate of 100–1000 sccm and an RF bias of 750–1200 watts applied to the support member to effectuate cleaning of the chamber. It is believed that the oxygen reacts with the parylene in a manner similar to the reaction of ozone with parylene.

The computer controller 340 controls all of the activities of the CVD chamber and a preferred embodiment of the controller 340 includes a hard disk drive, a floppy disk drive, and a card rack. The card rack contains a single board computer (SBC), analog and digital input/output boards, interface boards and stepper motor controller boards. The system controller conforms to the Versa Modular Europeans (VME) standard which defines board, card cage, and connector dimensions and types. The VME standard also defines the bus structure having a 16-bit data bus and 24-bit address bus.

Figure 7:
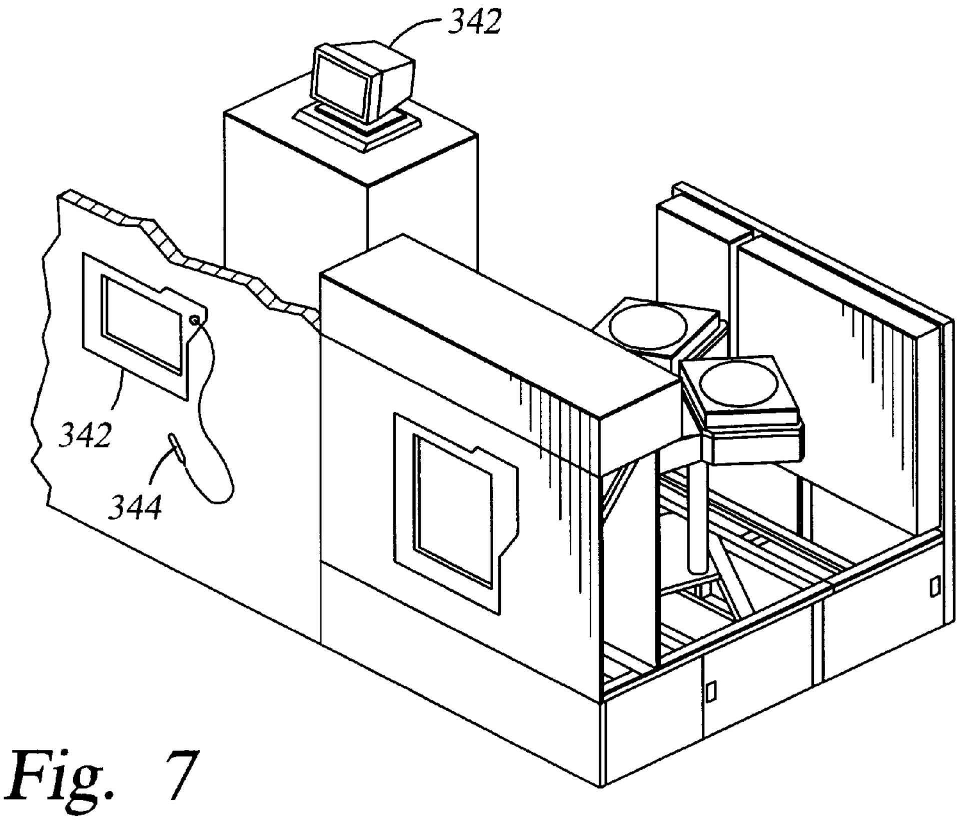
FIG. 7 is a diagram of the system monitor of the exemplary CVD processing chamber of FIG. 6.

The controller 340 operates under the control of a computer program stored on the hard disk drive 380. The computer program dictates the timing, mixture of gases, RF power levels, substrate support member, and other parameters of a particular process. The interface between a user and the system controller is a via a CRT monitor 342 and light pen 344 which is depicted in FIG. 7. In the preferred embodiment two monitors 342 are used, one mounted in the clean room wall for the operators and the other behind the wall for the service technicians. Both monitors 342 simultaneously display the same information, but only one light pen 344 is enabled. The lightpen 344 detects light emitted by CRT display with a light sensor in the tip of the pen. To select a particular screen or function, the operator touches a designated area of the display screen and pushes the button on the pen 344. The touched area changes its highlighted color, or a new menu or screen is displayed, confirming communication between the light pen and the display screen.

The process can be implemented using a computer program product 400 that runs on, for example, the computer controller 340. The computer program code can be written in any conventional computer readable programming language such as for example 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

Figure 8:
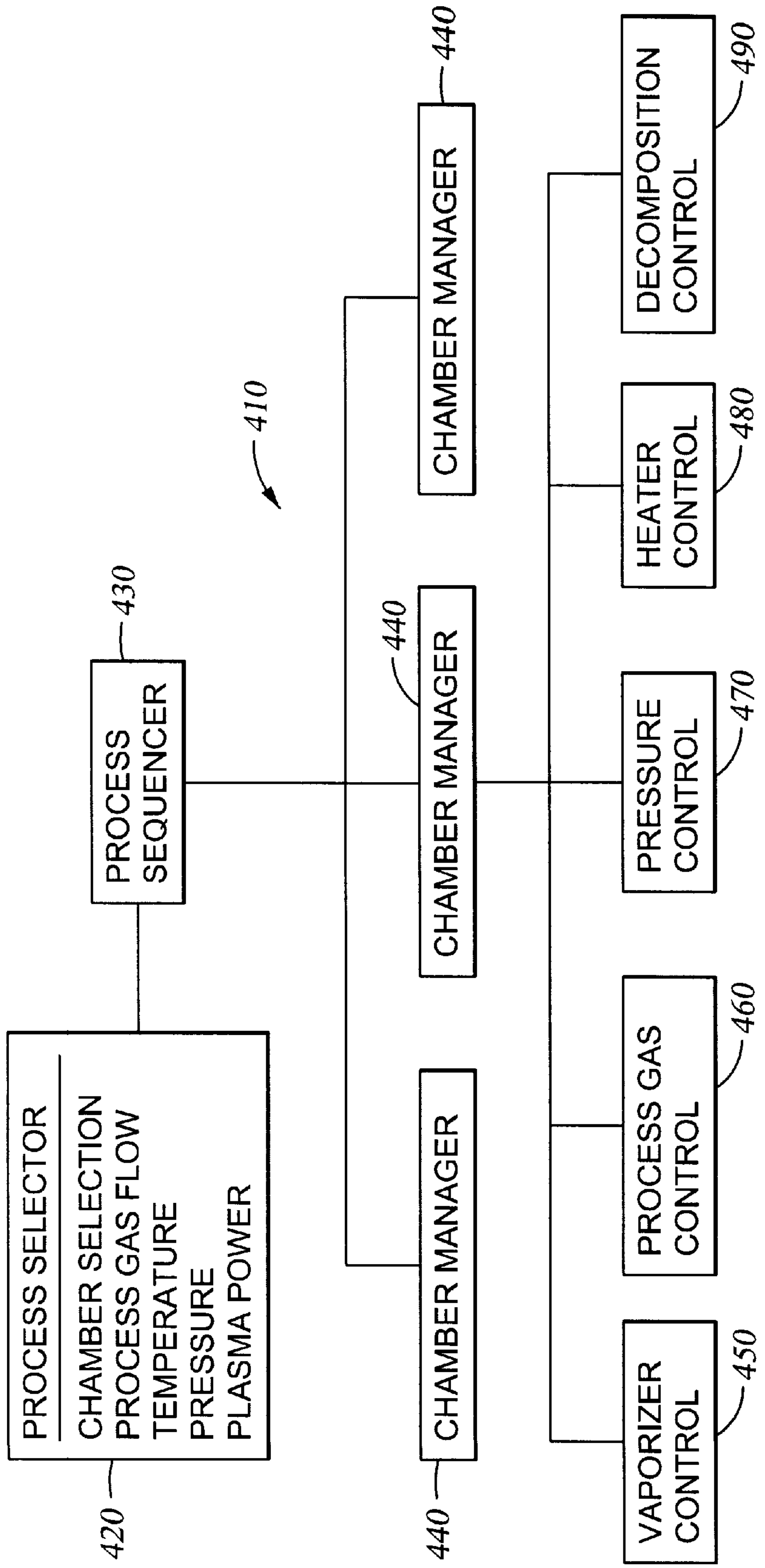
FIG. 8 is a flowchart of a computer program used for process control in conjunction with the exemplary CVD processing chamber of FIG. 6.

FIG. 8 shows an illustrative block diagram of the hierarchical control structure of the computer program 400. A user enters a process set number and process chamber number into a process selector subroutine 420 in response to menus or screens displayed on the CRT monitor by using the lightpen interface. The process sets are predetermined sets of process parameters necessary to carry out specified processes, and are identified by predefined set numbers. The process selector subroutine 420 identifies (i) the desired process chamber, and (ii) the desired set of process parameters needed to operate the process chamber for performing the desired process. The process parameters for performing a specific process relate to process conditions such as, for example, process gas composition and flow rates, temperature, pressure, plasma conditions such as RF bias power levels and magnetic field power levels, cooling gas pressure, and chamber wall temperature and are provided to the user in the form of a recipe. The parameters specified by he recipe are entered utilizing the lightpen/CRT monitor interface.

The signals for monitoring the process are provided by the analog input and digital input boards of the control means 340 and the signals for controlling the process are output on the analog output and digital output boards of the control means 340.

A process sequencer subroutine 430 comprises program code for accepting the identified process chamber and set of process parameters from the process selector subroutine 420, and for controlling operation of the various process chambers. Multiple users can enter process set numbers and process chamber numbers, or a user can enter multiple process set numbers and process chamber numbers, so the sequencer subroutine 430 operates to schedule the selected processes in the desired sequence. Preferably the sequencer subroutine 430 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such a polling. When scheduling which process is to be executed, the sequencer subroutine 430 can be designed to take into consideration the present condition of the process chamber being used in comparison with the desired process conditions for a selected process, or the "age" of each particular user entered request, or any other relevant factor a system programmer desires to include for determining scheduling priorities.

Once the sequencer subroutine 430 determines which process chamber and process set combination is going to be executed next, the sequencer subroutine 430 causes execution of the process set by passing the particular process set parameters to one of several chamber manager subroutines 440 which controls multiple processing tasks in a process chamber 60 according to the process set determined by the sequencer subroutine 430. The chamber manager subroutine 440 controls execution of various chamber component subroutines which control operation of the chamber components necessary to carry out the selected process set including the vaporizer 10 decomposition chamber 30, and cold trap 90. Examples of chamber component subroutines are vaporizer control subroutine 450, process gas control subroutine 460, pressure control subroutine 470, heater control subroutine 480, and decomposition control subroutine 490. Those having ordinary skill in the art would readily recognize that other chamber control subroutines can be included depending on what processes are desired. In operation, the chamber manager subroutine 440 selectively schedules or calls the process components subroutines in accordance with the particular process set being executed. The chamber manager subroutine 440 schedules the process component subroutines similarly to how the process sequencer 430 schedules which process equipment and process set is to be executed next. Typically, the chamber manager subroutine 440 includes steps of monitoring the various chamber components, determining which components needs to be operated based on the process parameters for the process set to be executed, and causing execution of a chamber component subroutine responsive to the monitoring and determining steps.

The process gas control subroutine 460 has program code for controlling process gas composition and flow rates. The process gas control subroutine 460 controls the open/close position of the safety shut-off valves, and also ramps up/down the mass flow controllers to obtain the desired gas flow rate. The process gas control subroutine 460 is invoked by the chamber manager subroutine 440, as are all chamber component subroutines, and receives from the chamber manager subroutine process parameters related to the desired gas flow rates. Typically, the process gas control subroutine 460 operates by opening the gas supply lines, and repeatedly (i) reading the necessary mass flow controllers, (ii) comparing the readings to the desired flow rates received from the chamber manager subroutine 440, and (iii) adjusting the flow rates of the gas supply lines as necessary. Furthermore, the process gas control subroutine 460 includes steps for monitoring the gas flow rates for unsafe rates, and activating the safety shut-off valves when an unsafe condition is detected.

An inert gas such as argon is preferably flowed into the chamber 60 to stabilize the pressure in the chamber before reactive process gases are introduced into the chamber. For these processes, the process gas control subroutine 460 is programmed to include steps for flowing the inert gas into the chamber 60 for an amount of time necessary to stabilize the pressure in the chamber, and then the steps described above would be carried out. Additionally, when the process gas is to be generated in the vaporizer 10, for example di-p-xylylene, the process gas control subroutine 460 can be written to obtain the carrier flow from the vaporizer control subroutine 450.

The pressure control subroutine 470 comprises program code for controlling the pressure in the chamber 60 by regulating the size of the opening of the throttle valve 80 in the exhaust system of the chamber. The size of the opening of the throttle valve 80 is set to control the chamber pressure to the desired level in relation to the total process gas flow, size of the process chamber, and pumping set point pressure for the exhaust system. When the pressure control subroutine 470 is invoked, the desired, or target, pressure level is received as a parameter from the chamber manager subroutine 440. The pressure control subroutine 470 operates to measure the pressure in the chamber 60 by reading one or more conventional pressure manometers connected to the chamber, compare the measure value(s) to the target pressure, obtain PID (proportional, integral, and differential) values from the stored pressure table corresponding to the target pressure, and adjust the throttle valve 80 according to the PID values obtained from the pressure table. Alternatively, the pressure control subroutine 470 can be written to open or close the throttle valve 80 to a particular opening size to regulate the chamber 60 to the desired pressure.

The heater control subroutine 480 comprises program code for controlling the temperature of the chamber 60. The heater control subroutine 480 is invoked by the chamber manager subroutine 440 and receives a target, or set point, temperature parameter. The heater control subroutine 480 measures the temperature by measuring voltage output of thermocouple located in the chamber 60, compares the measured temperature to the set point temperature, and increases or decreases current applied to the lamp module 260 and other heating components to obtain the set point temperatures. The temperature is obtained from the measured voltage by looking up the corresponding temperature in a stored conversion table, or by calculating the temperature using a fourth order polynomial.

The above CVD system description is mainly for illustrative purposes, and other CVD equipment may be employed. Additionally, variations of the above described system such as variations in substrate support design, heater design, location of RF power connections and others are possible.

The invention is further described by the following examples that describe specific embodiments and are not intended to limit the scope of the invention.

EXAMPLE 1

Tetraallyloxysilane

To further illustrate the process of the invention, an eight inch diameter silicon wafer was mounted on a fixed substrate support maintained at a temperature of about 25° C. in a M×P or D×Z deposition chamber, available from Applied Materials, Inc., of Santa Clara, Calif., is configured substantially as shown in FIGS. 1 through 12.

About 30 grams of particulate di-p-xylylene were loaded into the vaporizer 10 and the vaporizer was then heated to about 200° C. The gate valve 20 separating the vaporizer 10 from the decomposition chamber 30 was then opened, and the vapors of dimer were allowed to flow through a mass flow controller into the decomposition chamber 30 which was preheated to a temperature of about 850° C. The exit gate valve 40 of the decomposition chamber 30 was then opened and the vaporized reactive p-xylylene formed in the decomposition chamber 30 then flowed from the decomposition chamber through the heated conduit to the deposition chamber 60 at a rate of about 10 sccm. The lid of the deposition chamber 60 was maintained at a temperature of about 150° C., and the walls of the chamber 60 were maintained at about 100° C.

Tetraallyloxysilane was flown into the chamber 60 at a rate of 10 sccm. About 50 sccm of nitrogen and about 25 sccm of backside helium were flown into the deposition chamber 60 during the deposition and the valve 80 was set to maintain a pressure of 90 mTorr in the deposition chamber. The reactive p-xylylene monomer and comonomer vapors contacted the silicon wafer 200 and copolymerized thereon. After about 2–3 minutes, the flow of reactive monomer vapors was shut off by first shutting the gate valve 20 between the vaporizer 10 and the decomposition chamber 30, and then, after pumping out the decomposition chamber 30 to remove all monomer vapors from that chamber, shutting off the gate valve 40 between the decomposition chamber and the deposition chamber. The wafer 200 was then removed from the chamber 60 and examined.

The deposition rate of the parylene copolymer film was about 5000 Angstroms per minute. The film is estimated to contain about 95 wt % of polymerized p-xylylene and about 5 wt % of polymerized tetraallyloxysilane. The dielectric constant of the film was tested and found to be about 2.19. Thermal stability was substantially improved in comparison to parylene homopolymer as measured by thermogravimetric analysis (TGA) at 400° C., the copolymer film exhibiting less than 1% weight loss in comparison to a typical weight loss of greater than 1% for parylene-N homopolymer films. Presence of silicon/oxygen bonds in the polymer was confirmed by FI-IR. Analysis of remaining carbon—carbon double bonds also establishes that at least 3 of the 4 vinyl groups in the comonomer are polymerized.

EXAMPLE 2

Tetravinyltetramethylcyclotetrasiloxane

To further illustrate the process of the invention, an eight inch diameter silicon wafer was mounted on a fixed substrate support maintained at a temperature of about 0° C. in a M×P or D×Z deposition chamber as configured and described in Example 1. About 30 grams of particulate di-p-xylylene were loaded into the vaporizer 10 and the vaporizer was then heated to about 200° C. The gate valve 20 separating the vaporizer 10 from the decomposition chamber 30 was then opened, and the vapors of dimer were allowed to flow through a mass flow controller into the decomposition chamber 30 which was preheated to a temperature of about 850° C. The exit gate valve 40 of the decomposition chamber 30 was then opened and the vaporized reactive p-xylylene formed in the decomposition chamber 30 then flowed from the decomposition chamber through the heated conduit to the deposition chamber 60 at a rate of about 10 sccm. The lid of the deposition chamber 60 was maintained at a temperature of about 150° C., and the walls of the chamber 60 were maintained at about 100° C.

Tetravinyltetramethylcyclotetrasiloxane was flown into the chamber 60 at a rate of about 30 sccm. About 50 sccm of nitrogen and about 25 sccm of backside helium was flown into the chamber 60 during the deposition and the valve 80 was set to maintain a pressure of about 160 mTorr in the deposition chamber. The reactive p-xylylene monomer and comonomer vapors contacted the silicon wafer 200 and copolymerized thereon. After about 2–3 minutes, the flow of reactive monomer vapors was shut off by first shutting the gate valve 20 between the vaporizer 10 and the decomposition chamber 30, and then, after pumping out the decomposition chamber 30 to remove all monomer vapors from that chamber, shutting off the gate valve 40 between the decomposition chamber and the deposition chamber. The wafer 200 was then removed from the chamber 60 and examined.

The deposition rate of the parylene copolymer film was about 2500 Angstroms per minute. The film is estimated to contain about 90 to 97 wt % of polymerized p-xylylene and about 3 to 10 wt % of polymerized comonomer. The dielectric constant of the film was tested and found to be about 2.39. Thermal stability was substantially improved in comparison to parylene homopolymer as measured by TGA at 400° C., the copolymer film exhibiting less than 1% weight loss in comparison to a typical weight loss of greater than 1% for parylene-N homopolymer film. Presence of silicon/oxygen bonds in the polymer was confirmed by FI-IR. Analysis of remaining carbon—carbon double bonds also establishes that at least 3 of the 4 vinyl groups in the comonomer are polymerized.

What is claimed is:

1. A process of forming a copolymer layer on the surface of an object in a deposition chamber, comprising:

flowing p-xylylene and tetraallyloxysilane into the chamber; and depositing a copolymer layer onto the object by co-polymerizing the p-xylylene and the tetraallyloxysilane.

2. The process of claim 1, wherein the copolymer incurs less than 1% weight loss during thermogravimetric analysis at 400° C.

3. The process of claim 1, wherein the copolymer layer has a dielectric constant less than 2.2.

4. The process of claim 1, wherein at least three pendent carbon—carbon double bonds of said tetraallyloxysilane are substantially copolymerized.

* * * * *